United States Patent [19]

Ellion et al.

[11] Patent Number: 4,753,683

[45] Date of Patent: Jun. 28, 1988

[54] GALLIUM ARSENIDE SOLAR CELL SYSTEM

[75] Inventors: M. Edmund Ellion, Arcadia; George Wolff, Huntington Beach, both of Calif.

[73] Assignee: Hughes Aircraft Company, Los Angeles, Calif.

[21] Appl. No.: 929,571

[22] Filed: Nov. 12, 1986

Related U.S. Application Data

[63] Continuation-in-part of Ser. No. 773,696, Sep. 9, 1985, abandoned.

[51] Int. Cl.$^4$ .............................................. H01L 25/02
[52] U.S. Cl. ....................................... 136/244; 136/262
[58] Field of Search ................................ 136/244, 262

[56] References Cited

U.S. PATENT DOCUMENTS

| | | | |
|---|---|---|---|
| 3,370,986 | 2/1968 | Amsterdam et al. | 136/244 |
| 3,888,698 | 6/1975 | Lindmayer et al. | 136/256 |
| 4,004,949 | 1/1977 | Lesk | 148/1.5 |
| 4,084,985 | 4/1978 | Evans, Jr. | 136/206 |
| 4,283,590 | 8/1981 | Bilger et al. | 136/251 |
| 4,605,813 | 8/1986 | Takeuchi et al. | 136/244 |

FOREIGN PATENT DOCUMENTS

| | | | |
|---|---|---|---|
| 2500685 | 8/1982 | France | 136/244 |
| 135014 | 4/1979 | German Democratic Rep. | 136/244 |
| 55-21163 | 2/1980 | Japan | 136/244 |
| 56-58280 | 5/1981 | Japan | 136/244 |
| 58-194378 | 11/1983 | Japan | 136/244 |
| WO79/00813 | 10/1979 | PCT Int'l Appl | 136/262 |

OTHER PUBLICATIONS

Applied Physics Letter, vol. 46, No. 8, 15 Apr. 1985, American Institute of Physics, J. G. Werthen et al, "18.7 Efficient (1-Sun, AMO) Large-Area GaAs Solar Cells," pp. 776-778.
Revue de Physique Appliquee, vol. 17, No. 7, Jul. 1982, M. Le Metayer et al, "Une Photopile a Haute Rendement pour Utilisation Spatiale", pp. 415-419.
The Conference Record of the Fifteenth IEEE Photovoltaic Specialists Conference 1981, May 12-15, 1981, Kissimmee, Fla., G. W. Turner et al, "GaAs Shallow-Homojunction Concentrator Solar Cells", pp. 151-155.
JEE Journal of Electronic Engineering, vol. 19, No. 186, Jun. 1982, Tokyo, JP, Y. Yukimoto, "Research Advances for GaAs Solar Cells", pp. 39-42.
The Conference Record of the Fifteenth IEEE Photovoltaic Specialists Conference 1981, 12-15 May 1981, Kissimmee, Fla., J. C. C. Fan et al, "Thin-Film GaAs Solar Cells", pp. 666-672.
Applied Physics Letters, vol. 36, No. 1, Jan. 1, 1980, American Institute of Physics, (Woodbury, N.Y., U.S.), J. C. C. Fan et al, "Shallow-Homojunction GaAs Cells with High Resistance to 1-MeV Electron Radiation", pp. 53-56.

*Primary Examiner*—Aaron Weisstuch
*Attorney, Agent, or Firm*—S. M. Mitchell; M. J. Meltzer; A. W. Karambelas

[57] ABSTRACT

A solar cell array utilizing geometrically alternating, laterally disposed N-on-P and P-on-N gallium arsenide solar cells is disclosed. Improved array efficiency is achieved by placing adjacent solar cells in substantial contact with each other and eliminating bus connections on the top surfaces. This is accomplished by providing the solar cells with a lateral cross-sectional configuration of a parallelogram with the N-on-P solar cells slanted in one lateral direction and the P-on-N solar cells slanted in the opposite direction. The top surfaces of adjacent, contacting solar cells are electrically connected by extending a connector grid across the top surfaces. Strip connectors are used to join the bases of adjacent solar cells.

14 Claims, 2 Drawing Sheets

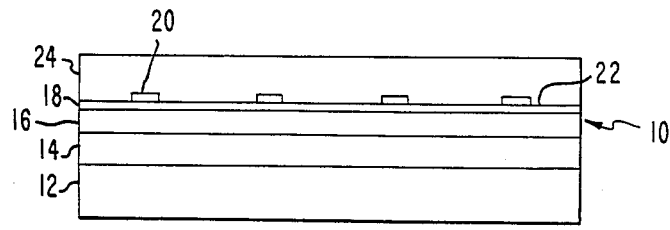
Fig. 1.
(PRIOR ART)
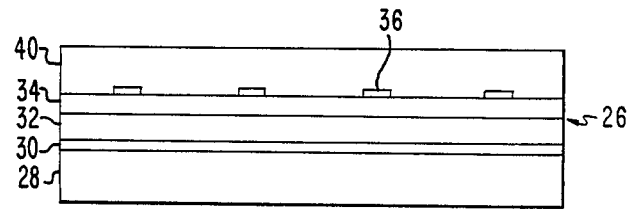
Fig. 2.
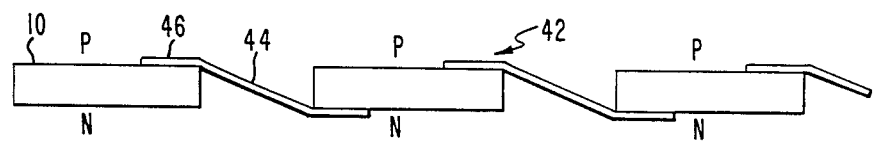
Fig. 3.
(PRIOR ART)
Fig. 4.
(PRIOR ART)
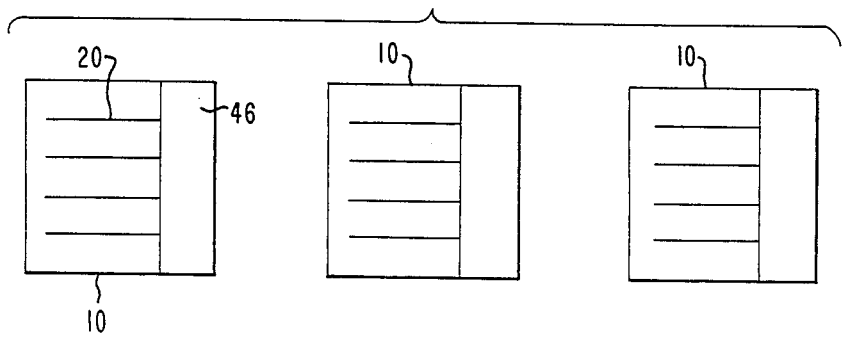

GALLIUM ARSENIDE SOLAR CELL SYSTEM

BACKGROUND OF THE INVENTION

This application is a continuation-in-part of copending prior application Ser. No. 773,696, filed Sept. 9, 1985, now abandoned.

This invention relates to solar cells, and more particularly, solar cell arrays utilizing alternating N-on-P and P-on-N gallium arsenide solar cells.

Semiconductor solar cells are utilized to convert light energy to useable electrical voltages and currents. Briefly, a typical semiconductor solar cell includes an interface between n-type and p-type transparent semiconductor materials. Light shining on the interface creates hole-electron pairs in addition to those otherwise present, and the minority charge carriers migrate across the interface in opposite directions. There is not a compensating flow of majority carriers, so that a net flow of electrical charge results. A useful electrical current is then obtained in an external electrical circuit by forming ohmic contacts to the materials on either side of the interface.

Semiconductor solar cells may be produced from a wide variety of semiconductor materials. Silicon solar cells are most widely used, but it has been found that cells fabricated from p-type and n-type gallium arsenide are particularly promising. Such solar cells have higher beginning-of-life efficiency and lower degradation with time and temperature in a space environment, as compared with silicon solar cells. Gallium arsenide solar cells are therefore particularly attractive, and have already found limited use. It is expected that gallium arsenide solar cells will find increased future application, in both space and on earth, particularly if the efficiency of solar cell arrays can be improved and inexpensive fabrication techniques are developed.

A gallium arsenide solar cell is fabricated by depositing the appropriate semiconductor layers onto a substrate, and then adding additional components to complete the cell. More specifically, for vapor phase formation, a conventional P-on-N gallium arsenide solar cell is fabricated by epitaxially depositing a layer of n-type gallium arsenide onto a single crystal gallium arsenide substrate, and depositing a layer of p-type gallium arsenide over the layer of n-type gallium arsenide. A P+ layer of gallium aluminum arsenide is deposited over the layer of p-type gallium arsenide to limit surface recombination of charge carriers. A slightly different growth procedure is used when the cells are grown by the liquid phase epitaxial method. A series of thin electrically conductive grids are deposited over the P+ layer in order to carry the electrons from the cell to the collecting bus bar. A transparent cover of glass is applied over the gallium aluminum arsenide to protect the active semiconductor components from physical contact and radiation damage such as encountered in a space environment. The p-type gallium arsenide faces the sun during operation of the cell, as indicated by the terminology "P-on-N" solar cell.

The individual solar cells, typically measuring about 2 centimeters by 4 centimeters in lateral dimensions, are joined together in large arrays to produce useable electrical voltages and currents. The arrays may have as many as ten thousand individual solar cells. Since the electrical output of each individual P-on-N solar cell is only about 0.9 volts, in an array a number of P-on-N solar cells are connected in a series fashion to provide an electrical voltage which is the sum of the voltages of the individual series-connected solar cells.

To accomplish the series electrical connection, the upper layer (i.e. p-type gallium arsenide) of a first solar cell is connected to the lower layer (i.e. n-type gallium arsenide) of a laterally adjacent second solar cell, and this connection approach is repeated from the second to the third solar cell, and so forth. This connection approach requires that the laterally adjacent solar cells be spaced a sufficient distance apart, typically two millimeters, so that a connector can be inserted between the laterally adjacent cells. A "z" connector is used for making the connection, with the upper leg of the "z" soldered to the top collector bus bar of the first solar cell and the lower leg soldered to the bottom of the laterally adjacent second solar cell. The active area of the cell that is available to produce electricity is reduced by the area covered or shaded by the electrically conductive grids as well as the collector bus bar and the connector attachment to the top surface. The necessary lateral spacing of the cells which permits the insertion of the "z" connector also reduces the electrical efficiency of the array. (The term "efficiency" is used here to mean the electrical output of the array per unit area of the array.) The geometrical limitations thereby imposed on the efficiency of the solar cell arrays, due to the spacing needed between adjacent cells to insert the connectors without producing short circuits between the cells, and the area shaded by the end connections, can significantly reduce the overall efficiency of the array in terms of electrical output per unit area of array.

There therefore exists a continuing need for improving the efficiency of a solar cell array. A more efficient solar cell array would desirably utilize the benefits achievable through the use of known solar cell materials of construction. The solar cell array also should not be less resistant to radiation damage in a solar space environment than existing types of arrays constructed from the same materials of construction. The present invention fulfills this need, and further provides related advantages.

SUMMARY OF THE INVENTION

The present invention resides in an improved gallium arsenide solar cell, and solar cell arrays using the improved solar cell. The improved solar cell incorporates a modified construction which achieves substantially the same performance as conventional gallium arsenide solar cells, and in addition allows the interconnection of solar cells in an array to be accomplished in a manner which increases the overall output efficiency of the array. Arrays employing the improved solar cell require less complex interconnection hardware and procedures, allow closer packing of the individual solar cells to achieve increased electrical output per unit area of the array, and provide decreased problems resulting from differential thermal expansion of the individual cells in the array. The solar cell arrays of the invention can otherwise be used in a fashion identical with that of existing solar cell arrays, and have the same resistance to radiation damage.

In accordance with the invention, an N-on-P gallium arsenide solar cell comprises a single crystal gallium arsenide substrate, a single crystal layer of p+ gallium aluminum arsenide epitaxially overlying the substrate, a single crystal layer of p-type gallium arsenide epitaxially overlying the layer of gallium aluminum arsenide, and a single crystal layer of n-type gallium arsenide epitaxially overlying the layer of p-type gallium arsenide. The cell has a lateral cross-sectional shape of a parallelogram to allow good electrical contact between adjacent cells at the desired location without shorting problems. In operation, the n-type gallium arsenide layer faces the sun. This N-on-P cell achieves similar electrical output and resistance to radiation damage as conventional P-on-N gallium arsenide solar cells. The N-on-P solar cell is covered with a transparent cover such as glass to protect it and allow handling. The layer of p-type gallium arsenide is typically about 0.5 micrometers thick to limit space radiation degradation, and the layer of n-type gallium arsenide is typically about 10 micrometers thick.

In accordance with another aspect of the invention, a solar cell module comprises an N-on-P solar cell laterally joined to a P-on-N solar cell, and a conventional array of connector grids that now extend contiguously across the top surfaces of both cells. A solar cell array is formed by placing such modules laterally adjacent to each other and electrically connecting adjacent bottom surfaces of the p-layer of the N-on-P solar cell to the n-layer of the adjacent P-on-N solar cell of the adjacent module. When the adjacent modules are connected in this fashion, no top bus bar connections are required, so that there is no shading of a large portion of each solar cell, with consequent reduced efficiency, due to top bus bar connections. Since the bus bar connections typically shade a much larger portion of the solar cell than the fine grids, an appreciable increase in the active current generating area is realized.

In yet another aspect of the invention, each cell of the solar cell module has a separate connector grid on its top surface. A corresponding connector grid is applied to the bottom surface of the transparent glass cover which extends across the pair of cells in a module, thus connecting the top layers of adjacent cells. A solar cell array is formed by placing such modules laterally adjacent each other and electrically connecting adjacent bottom surfaces of the p-layer of the N-on-P solar cell to the n-layer of the adjacent P-on-N solar cell of the adjacent module.

The use of laterally adjacent, geometrically alternating N-on-P and P-on-N solar cells in a solar cell array allows increased ease of construction of the solar cell array, since laterally adjacent n-type and p-type layers can be connected directly together, without the need for top-to-bottom connectors such as "z" type connectors. Consequently, the solar cells may be more tightly packed in the solar cell array, leading to higher array efficiencies. Further, modules may be constructed to be joined in an array which has no top bus bar connections that shade a large portion of the active area of the array. Other features and advantages of the present invention will become apparent from the following more detailed description, taken in conjunction with the accompanying drawings, which illustrate, by the way of example, the principles of the invention.

BRIEF DESCRIPTION OF THE DRAWINGS

FIG. 1 is an elevational view of a conventional P-on-N solar cell;

FIG. 2 is an elevational view of an N-on-P solar cell;

FIG. 3 is an elevational view of a conventional solar cell array incorporating P-on-N solar cells;

FIG. 4 is a top plan view of the solar cell array of FIG. 3;

DETAILED DESCRIPTION OF THE PREFERRED EMBODIMENT

Figure 5:
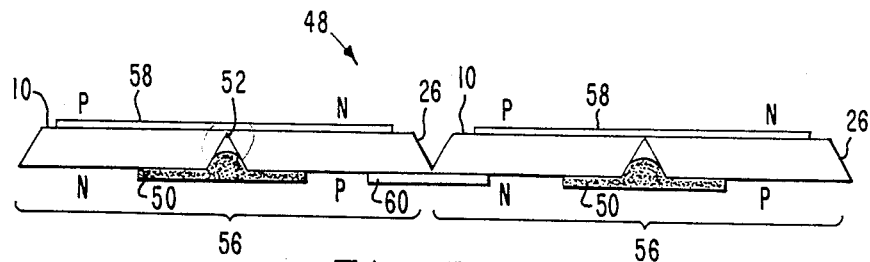
FIG. 5 is an elevational view of a solar cell array utilizing alternating P-on-N and N-on-P solar cells.

A conventional P-on-N gallium arsenide solar cell 10, as illustrated in FIG. 1, is prepared in the following manner. The solar cell 10 is fabricated on a gallium arsenide single crystal substrate 12, which may be prepared by any of several well established techniques. Most commonly, a gallium arsenide single crystal is fabricated by the horizontal Bridgeman technique. Substrates suitable for use in the preparation of solar cells are prepared by slicing wafers about 200 micrometers thick from the solidified single crystal. The surface orientation of the wafers is typically selected to be about (100) (cubic Miller indices notation). Gross damage induced during the slicing procedure is removed by polishing the wafer on successively finer grits of metallographic polishing paper, finishing with a 4/0 diamond paste. The polished wafer is then etched in a solution of hydrogen peroxide and ammonium hydroxide to remove any residual polishing damage.

A single crystal layer 14 of n-type gallium arsenide is epitaxially deposited overlying the gallium arsenide single crystal substrate 12. The n-type gallium arsenide of the layer 14 preferably has a net charge carrier concentration of about $10^{18}$ per cubic centimeter and a thickness of about 10 micrometers.

A single crystal layer 16 of p-type gallium arsenide is next epitaxially deposited overlying the layer 14 of n-type gallium arsenide. Preferably, the p-type gallium arsenide in the layer 16 has a net charge carrier concentration of about $10^{18}$ per cubic centimeter, with a thickness of about 0.5 micrometers or less. The junction between the layer 14 of n-type gallium arsenide and the layer 16 of p-type gallium arsenide provides a basic solar cell, but the operation of this solar cell is adversely affected by surface charge recombination at the top surface of the layer 16, unless charge recombination is inhibited. Conventionally, to inhibit surface charge recombination, a p+ gallium aluminum arsenide single crystal inhibitory layer 18 is epitaxially deposited on top of the layer 16 of p-type gallium arsenide. The p+ gallium aluminum arsenide layer 18 preferably has a net charge carrier concentration of about $2 \times 10^{18}$ per cubic centimeter, with a thickness of about 0.1 micrometers. A typical composition of gallium aluminum arsenide having these characteristics is about $Ga_{0.7}Al_{0.3}As$.

The layers 14, 16, and 18 are deposited by techniques well known in the art, preferably liquid phase epitaxial growth or vapor phase metal-organic chemical vapor deposition. The vapor phase procedure is described above. Vapor phase metal-organic chemical vapor deposition takes place when tri-metal gallium in a gaseous form mixes with arsine gas. The mixture decomposes into gallium arsenide and is deposited on a gallium arsenide substrate at 750° C. in a low-pressure chamber. The liquid phase epitaxial growth of gallium arsenide solar cells is accomplished by dipping substrates of gallium arsenide into a gallium melt saturated with gallium arsenide. This process is slightly different than the vapor phase method. It is performed with the melt at 750° C.

in a sealed, nitrogen purged system. The net charge carriers are diffused subsequently into the layers.

To lower the electrical resistance and to facilitate electrical connection to the upper surfaces of the solar cell 10, a metallic connector grid 20 is deposited on an upper face 22 of the solar cell 10. The metal is deposited in a vacuum environment using conventional sputtering or vapor deposition techniques. The individual very thin lines of the connector grid 20 are spaced about two millimeters apart, so that electron charge carriers may readily diffuse through the semiconductor layers 14, 16, and 18 to be collected by the individual elements of the connector grid 20. If the individual elements are too widely spaced, they cannot readily collect the electrons and a loss of voltage will occur.

A transparent cover 24 is attached to the upper face 22. The composition and thickness of the transparent cover 24 are selected to optimize the electrical performance of the solar cell 10. Preferably, the transparent cover 24 is a silica glass such as Corning Glass type 7940, having a thickness of about 200 micrometers. The transparent cover 24 performs three important functions. First, the cover 24 allows light to pass through to the layers 14 and 16. Second, the cover 24 supports the remaining elements of the solar cell 10. Third, the cover 24 protects the remaining elements of the solar cell 10 from physical damage and certain types of radiation in a space environment such as low energy protons and ultra violet light.

The transparent cover 24 may be bonded to the layer 18 by any suitable technique, such as by a transparent adhesive or electrostatic bonding. It is preferable that the bonding technique permit retention of the bond at temperatures as high as about 200° C., to resist delamination in use if thermal annealing is employed to reduce radiation degradation. High temperature adhesives of high molecular weight compounds such as carborane siloxane polymer have been found to be operable.

In accordance with one aspect of the present invention, and as illustrated in FIG. 2, an N-on-P gallium arsenide solar cell 26 is prepared by furnishing a gallium arsenide single crystal substrate 28 substantially identical to the substrate 12 previously described. A single crystal layer 30 of p+ gallium aluminum arsenide is epitaxially deposited overlying the substrate 28, to inhibit surface charge recombination. A single crystal layer 32 of p-type gallium arsenide is then epitaxially deposited overlying the layer 30. An n-type gallium arsenide layer 34 is then epitaxially deposited over the layer 32. A connector grid 36 without the bus bar is deposited upon an upper face of the layer 34 of n-type gallium arsenide. Finally, a transparent cover 40 is fastened over the connector grid 36 and the layer 34.

The characteristics of the layers 30, 32, and 34, the methods for depositing the layers 30, 32, and 34, the geometrical arrangement, structure and method of depositing the connector grid 36, and the structure and method of attaching the transparent cover 40 in relation to the N-on-P gallium arsenide solar cell 26 are all substantially identical to the corresponding aspects of the conventional P-on-N gallium arsenide solar cell 10, described in the preceding paragraphs. Only the order of depositing the active layers 30, 32, and 34 to form the N-on-P solar cell 26 differs from the order of depositing the layers 14, 16, and 18 to form the conventional P-on-N solar cell 10 is different.

It has been found that the N-on-P solar cell 26 exhibits nearly identical electrical performance and resistance to radiation damage as the P-on-N solar cell 10. In fact, the electrical performance of the N-on-P gallium arsenide solar cell degrades slightly less with the passage of time, as compared with a conventional P-on-N gallium arsenide solar cell. The maximum power available from the conventional P-on-N solar cell will degrade approximately 20 percent when exposed to 1 MEV electrons at a fluence of $10^{15}$, which is equivalent to almost 5 years in synchronous orbit.

Individual P-on-N solar cells 10 each produce a voltage output of about 0.9 volts, which is too low a voltage for any practical application in a space environment. The P-on-N solar cells 10 are therefore conventionally hooked together in a series fashion to obtain an output voltage equal to the sum of the voltages produced by the individual solar cells 10. Identical groups of the solar cells joined in series are then hooked together in a parallel fashion to achieve increased electrical currents as required.

FIGS. 3 and 4 illustrate the manner of interconnecting conventional P-on-N solar cells to form a conventional solar cell array 42. To achieve a series connection, the top or p-type layer 16 of one solar cell 10 must be electrically connected through the P+ layer 18 to the bottom or n-type layer 14 through the substrate 12 of the adjacent cell. The type of connectors utilized are termed "z-connectors" 44, because of their shape when viewed in an elevational view. The z-connectors 44 are joined to the bus bars 46 that interconnect the grid 20 on each cell in order to connect these elements to the adjacent solar cell 10. The conventional z-connector 44 includes a horizontal portion at each end and an inclined portion extending from the top to bottom of the solar cells. The horizontal portions are soldered or otherwise connected to the bus bars 46 of the solar cell 10 to form the connections. The area of the attachment under the horizontal portion of the z-connector 44 and the bus bar 46 is inactive and cannot produce an electrical current, since the junction between the layers 14 and 16 is shaded from the rays of the sun by the connector and bus bar 46. The electrical output of a conventional solar cell array 42 is therefore reduced below its potential current output due to the spacing between adjacent solar cells, which must be maintained to accommodate the z-connector 44, and the inactive area shaded by the connector and bus bar extending along one side of each solar cell.

In accordance with another aspect of the invention, P-on-N solar cells and N-on-P solar cells may be geometrically alternated to form solar cell arrays whose electrical current output efficiency is increased because the individual solar cells may be placed more closely together, and because in some configurations the bus bars joined to the upper surfaces of the solar cells may be eliminated.

Figure 6:
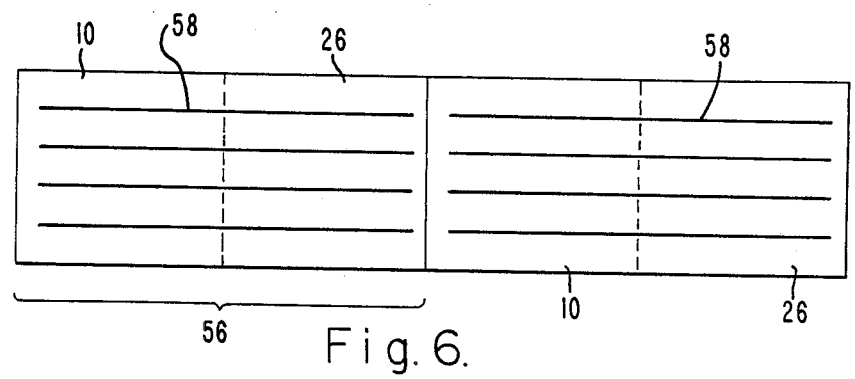
FIG. 6 is a top plan view of the solar cell array of FIG. 5.

FIGS. 5 and 6 illustrate a first configuration 48 wherein a P-on-N solar cell 10 and an N-on-P solar cell 26 are grouped together as a module 56. In such a module 56, a connector grid 58 extends continuously across the upper surface of the module 56 between the solar cells 10 and 26, electrically connecting the p layer of the P-on-N solar cell 10 to the n layer of the N-on-P solar cell 26. A non-conductive adhesive 50 is used to tightly bond the cells 10 and 26 together to form each module 56. This allows the connector grid 58 to be vapor deposited so as to extend across the top surfaces of the cells. As seen exaggerated in FIG. 5, each cell is formed at a very slight angle from the normal crystal so that when formed, the sides have a slight slope. The cells 10, 26 of each module 56 are in contact at a top surface edge 52. The angle formed by the top surface and side of each cell 10, 26 at the top surface edge 52 may typically deviate from 90° by about 1°. This provides sufficient separation of adjacent cell sides to prevent shorting of the cells while providing good electrical contact at the top surfaces and minimizes any inactive surface area. Adjacent modules 56 are connected together only at their lower surfaces, by a metallic connector 60. The metallic connector 60 provides an electrical connection from the N-on-P solar cell 26 of a first active pair 56 to the P-on-N solar cell 10 of a second active pair 56, and so on.

The configuration 48 is used to optimize the output efficiency of an array by reducing both geometrical components of electrical output loss found in conventional solar cell arrays 42. The loss due to the spacing between adjacent cells is drastically reduced, inasmuch as there is no spacing between the two solar cells comprising each module 56. Additionally, the need for bus bars at the upper surfaces of the solar cells is eliminated through the use of the continuous connector grid 58. That is, there is no area of the upper surface of any of the solar cells making up the configuration 48 that is inactive as a result of being shaded from the sun by an upper bus bar connecting adjacent solar cells. It is estimated that the reduction in the cell spacing can result in an increased efficiency of about 4 percent. It is further estimated the elimination of the top bus bars in the configuration 48 can result in an increased efficiency of about 6 percent. Thus, the overall improvement in efficiency, in watts per unit area of array, of the configuration 48 illustrated in FIGS. 5 and 6 can be as much as 10 percent.

Figure 7:
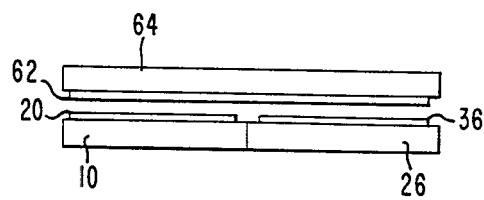
FIG. 7 is an elevational view of a solar cell module utilizing a connector grid on a cover glass to electrically interconnect the top surfaces of adjacent solar cells.

In a second configuration shown in FIG. 7, the electrical interconnection of the solar cells 10, 26 of module 56 is provided by a conductor grid 62 on a transparent cover glass 64. Solar cell 10 includes the connector grid 20 and solar cell 26 includes the connector grid 36 as shown in FIGS. 1 and 2. A grid 62 is placed on the cover glass 64 to match the grids 20 and 36 and then the cover glass grid 62 and two solar cell grids 20 and 36 are fused together to form two cell module 56. In this manner, the two cells are held rigidly together and are electrically connected. Individual modules may then be interconnected by metallic conductors along the bottom surfaces.

In another embodiment, not shown, a pair of P-on-N and N-on-P solar cells are bonded together on the bottom surface by a metallic conductor to form a module. Individual modules are then joined together with adjacent modules to form an array by interconnecting adjacent cells of individual modules with a connector grid on a cover glass similar to the one shown in FIG. 7.

As will now be appreciated, the development of the complementary N-on-P solar cell having substantially the same electrical characteristics and resistance to degradation by radiation allows the construction of large solar cell arrays having increased electrical output per unit area of array, by eliminating the need for top-to-bottom electrical connections between adjacent solar cells of the array. Assembly of the solar cell array is made easier through the use of modules, each incorporating two solar cells. The modules may be assembled separately, and then joined together using flat connector bars into the solar cell array. Although a particular embodiment of the invention has been described in detail for purposes of illustration, various modifications may be made without departing from the spirit and scope of the invention. Accordingly, the invention is not to be limited except as by the appended claims.

What is claimed is:

1. A solar cell module, comprising:
    an N-on-P first solar cell including an n-type semiconductor layer and a p-type semiconductor layer, said first solar cell having a lateral cross-sectional configuration with a top surface and a first lateral side forming an acute angle at a first top surface edge;
    a P-on-N second solar cell including a p-type semiconductor layer and an n-type semiconductor layer, said second solar cell having a lateral cross-sectional configuration with a top surface and a first lateral side forming an acute angle at a first top surface edge;
    said first and second solar cells being positioned laterally adjacent each other such that said first top surface edges of said cells are in substantial contact; and
    means for electrically connecting said n-type layer of said first solar cell to said p-type layer of said second solar cell.

2. The solar cell module of claim 1, wherein said connecting means comprises a grid of electrical conductors extending between said n-type layer of said first solar cell and said p-type layer of said second solar cell.

3. The solar cell module of claim 2, and further including a transparent cover over said top surfaces and said grid of electrical conductors.

4. A solar cell module, comprising:
    an N-on-P first solar cell including an n-type semiconductor layer and a p-type semiconductor layer, said first solar cell having a lateral cross-sectional configuration of a parallelogram with the top surface and one of the lateral sides forming an acute angle at a top surface edge;
    a P-on-N second solar cell including a p-type semiconductor layer and an n-type semiconductor layer, said second solar cell having a lateral cross-sectional configuration of a parallelogram with the top surface and one of the lateral sides forming an acute angle at a top surface edge;
    said first and second solar cells being positioned laterally adjacent each other such that said top surface edges of said cells are in substantial contact; and
    means for electrically connecting said n-type layer of said first solar cell to said p-type layer of said second solar cell.

5. The solar cell module of claim 4, and further including a transparent cover over said top surfaces and said connecting means.

6. The solar cell module of claim 5, wherein said connecting means comprises a grid of electrical conductors extending between said n-type layer of said first solar cell and said p-type layer of said second solar cell.

7. The solar cell module of claim 5, wherein said connecting means comprises:
    a first grid of electrical conductors on said n-type layer of said first solar cell;
    a second grid of electrical conductors on said p-type layer of said second solar cell; and
    a corresponding grid of electrical conductors on the bottom surface of said transparent cover such that said first grid is electrically connected to said second grid.

8. The solar cell module of claim 5, wherein said solar cells are gallium arsenide solar cells.

9. A solar cell array, comprising:

a plurality of N-on-P solar cells each having a top and a bottom surface and having a lateral cross-sectional configuration of a parallelogram sloped in a first lateral direction;

a plurality of P-on-N solar cells, each having a top and a bottom surface and having a lateral cross-sectional configuration of a parallelogram sloped in a second lateral direction opposite said first direction;

each of said N-on-P solar cells being positioned in substantial contact with and laterally adjacent at least one of said P-on-N solar cells; and means for electrically interconnecting adjacent solar cells of said solar cell array.

10. The solar cell array of claim 9, and further including a transparent cover over said top surfaces of said solar cells.

11. The solar cell array of claim 10, wherein a top surface edge of each N-on-P solar cell is in substantial contact with a top surface edge of an adjacent P-on-N solar cell and wherein said means for electrically interconnecting includes a grid of electrical conductors extending between said top surfaces of each pair of adjacent solar cells across said contacting top surface edges.

12. The solar cell array of claim 11, wherein said means for electrically interconnecting further includes a plurality of metallic conductors extending between said bottom surfaces of adjacent solar cells which are not in contact at a top surface edge.

13. The solar cell array of claim 10, wherein said means for electrically interconnecting includes a grid of electrical conductors on said top surface of each of said solar cells and a corresponding grid of electrical conductors on a bottom surface of said transparent cover such that said top surfaces of adjacent pairs of said solar cells are electrically connected.

14. The solar cell array of claim 10, wherein said solar cells are gallium arsenide solar cells.

* * * * *